(12) United States Patent
Zhu et al.

(10) Patent No.: US 7,718,513 B2
(45) Date of Patent: May 18, 2010

(54) FORMING SILICIDED GATE AND CONTACTS FROM POLYSILICON GERMANIUM AND STRUCTURE FORMED

(75) Inventors: Huilong Zhu, Poughkeepsie, NY (US); Wenjuan Zhu, Carmel, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 11/734,888

(22) Filed: Apr. 13, 2007

(65) Prior Publication Data

US 2008/0251856 A1    Oct. 16, 2008

(51) Int. Cl.
*H01L 21/20* (2006.01)
(52) U.S. Cl. .............. 438/478; 438/243; 438/386
(58) Field of Classification Search ........ 438/386, 438/243, 478
See application file for complete search history.

(56) References Cited

U.S. PATENT DOCUMENTS

| | | | | |
|---|---|---|---|---|
| 5,006,911 A | * | 4/1991 | Sivan | 257/328 |
| 5,453,389 A | * | 9/1995 | Strain et al. | 438/368 |
| 7,214,592 B2 | * | 5/2007 | Surdeanu | 438/306 |
| 2001/0019901 A1 | * | 9/2001 | Sano et al. | 438/769 |
| 2002/0008261 A1 | * | 1/2002 | Nishiyama | 257/288 |
| 2003/0006415 A1 | * | 1/2003 | Yokogawa et al. | 257/77 |
| 2008/0242039 A1 | * | 10/2008 | Ku et al. | 438/305 |

\* cited by examiner

*Primary Examiner*—Thanh V Pham
*Assistant Examiner*—Caleb Henry
(74) *Attorney, Agent, or Firm*—Joseph Petrokaitis; Hoffman Warnick LLC

(57) ABSTRACT

Methods of forming silicided contacts self-aligned to a gate from polysilicon germanium and a structure so formed are disclosed. One embodiment of the method includes: forming a polysilicon germanium (poly SiGe) pedestal over a gate dielectric over a substrate; forming a poly SiGe layer over the poly SiGe pedestal, the poly SiGe layer having a thickness greater than the poly SiGe pedestal; doping the poly SiGe layer; simultaneously forming a gate and a contact to each side of the gate from the poly SiGe layer, the gate positioned over the poly SiGe pedestal; annealing to drive the dopant from the gate and the contacts into the substrate to form a source/drain region below the contacts; filling a space between the gate and the contacts; and forming silicide in the gate and the contacts.

6 Claims, 7 Drawing Sheets

FORMING SILICIDED GATE AND CONTACTS FROM POLYSILICON GERMANIUM AND STRUCTURE FORMED

BACKGROUND

1. Technical Field

The disclosure relates generally to integrated circuit (IC) fabrication, and more particularly, to methods of forming silicided contacts self-aligned to gates and a structure formed.

2. Background Art

In the integrated circuit (IC) fabrication industry, generating ICs having high density structures thereon can reduce manufacturing costs since more ICs are formed in any given area. In addition, high density structures allow for increased performance of the ICs. However, generating more structures in a smaller area requires smaller contacts and smaller distances among contacts. Contacts being closer to one another increases the contact resistance and the probability that electrical shorting occurs among the contacts. In addition, smaller size contacts make it difficult to etch (e.g., reactive ion etch (RIE)) contact holes and/or increase the probability of contact opening.

SUMMARY

Methods of forming silicided contacts self-aligned to a gate from polysilicon germanium and a structure so formed are disclosed. One embodiment of the method includes: forming a polysilicon germanium (poly SiGe) pedestal over a gate dielectric over a substrate; forming a poly SiGe layer over the poly SiGe pedestal, the poly SiGe layer having a thickness greater than the poly SiGe pedestal; doping the poly SiGe layer; simultaneously forming a gate and a contact to each side of the gate from the poly SiGe layer, the gate positioned over the poly SiGe pedestal; annealing to drive the dopant from the gate and the contacts into the substrate to form a source/drain region below the contacts; filling a space between the gate and the contacts; and forming silicide in the gate and the contacts.

A first aspect of the disclosure provides a method of comprising: forming a polysilicon germanium (poly SiGe) pedestal over a gate dielectric over a substrate; forming a poly SiGe layer over the poly SiGe pedestal, the poly SiGe layer having a thickness greater than the poly SiGe pedestal; doping the poly SiGe layer; simultaneously forming a gate and a contact to each side of the gate from the poly SiGe layer, the gate positioned over the poly SiGe pedestal; annealing to drive the dopant from the gate and the contacts into the substrate to form a source/drain region below the contacts; filling a space between the gate and the contacts; and forming silicide in the gate and the contacts.

A second aspect of the disclosure provides a structure comprising: a polysilicon germanium gate; and a polysilicon germanium contact to each side of the gate, the contacts being fully silicided.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
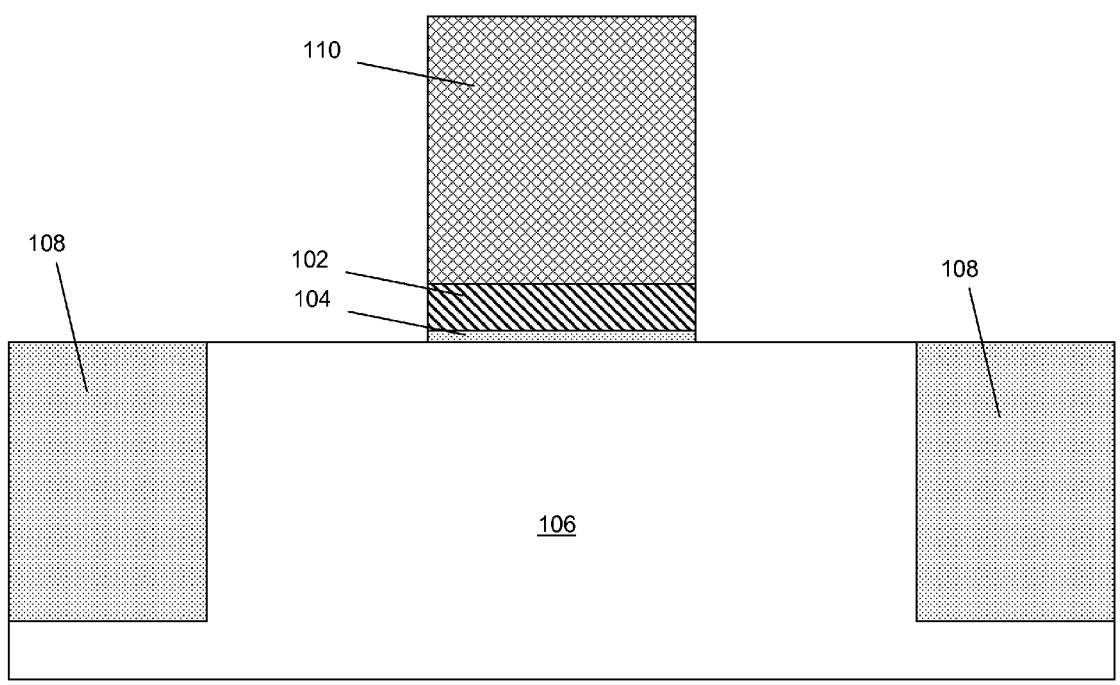
FIGS. 1-7 show embodiments of a method of forming silicided gate and contacts from polysilicon germanium, with FIG. 7 showing embodiments of a structure.
Figure 5:
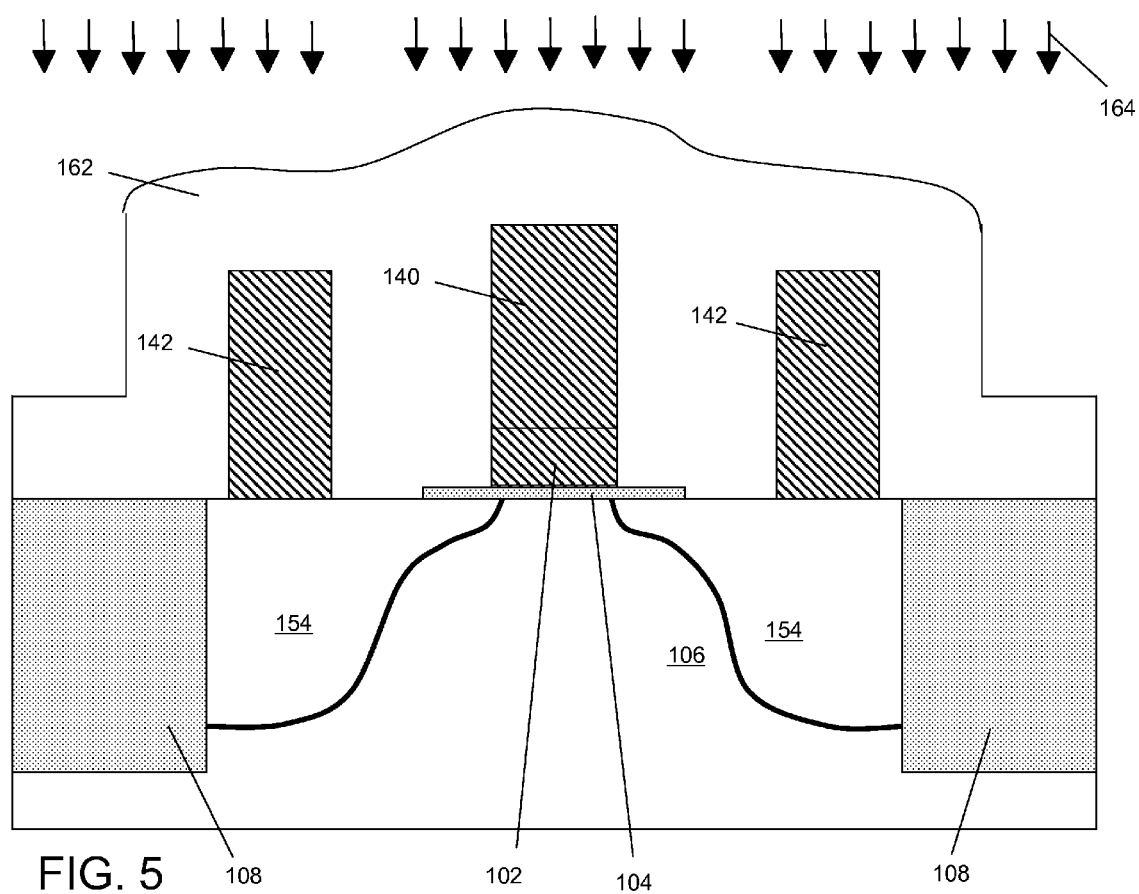
Figure 6:
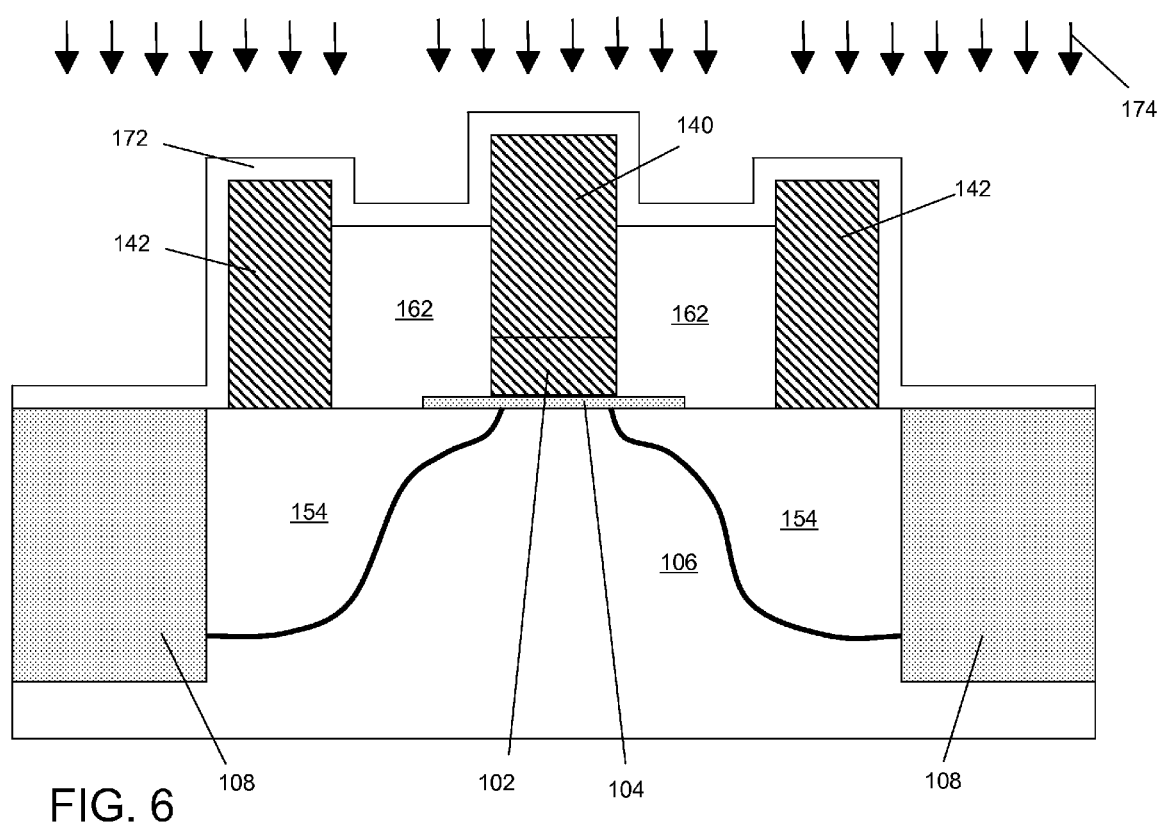
Figure 7:
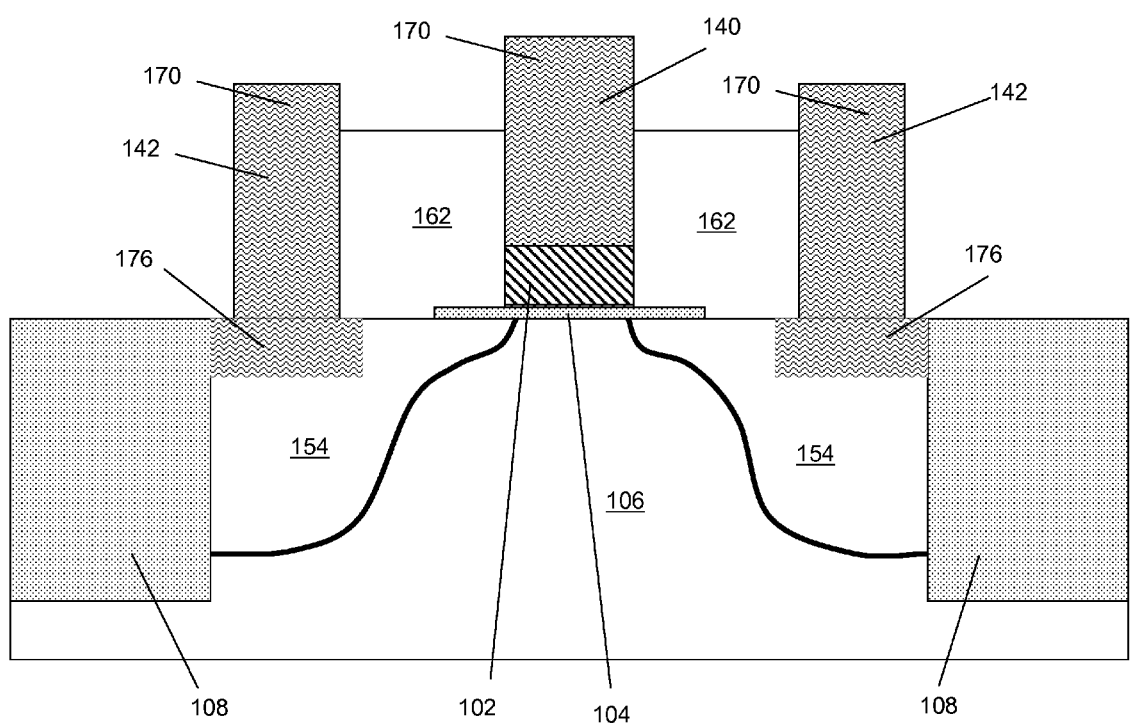

FIGS. 1-7 show embodiments of a method of forming silicided gate and contacts from polysilicon germanium, with FIG. 7 showing embodiments of a structure. FIG. 1 shows forming a polysilicon germanium (poly SiGe) pedestal 102 over a gate dielectric 104 over a substrate 106. Isolation regions 108 may be formed within substrate 106 using any known technique, e.g., forming openings in substrate 106 and filling with silicon oxide ($SiO_2$).

Poly SiGe pedestal 102 may be formed using any now known or later developed techniques. For example, in one embodiment, gate dielectric 104 is formed, e.g., by thermal oxidation, over substrate 106 followed by deposition of a poly SiGe layer (not shown in its entirety). A photoresist 110 is then deposited and patterned. Poly SiGe pedestal 102 along with gate dielectric 104 may then be patterned using any appropriate etching technique, e.g., a series reactive ion etches. Gate dielectric 104 may have a thickness of, for example, approximately 0.5 nanometers (nm) to approximately 10 nm, with 'approximately' in the range of +/−0.1 nm. Poly SiGe pedestal 102 may have a thickness of approximately 5 nm to approximately 30 nm, with 'approximately' in the range of +/−0.3 nm. In one embodiment, poly SiGe pedestal 102 has an atomic fraction concentration of germanium in the poly SiGe, i.e., approximately from 0.01% to approximately 0.03%, which represents a relatively low concentration of germanium (Ge) in the SiGe.

Gate dielectric 104 may include but is not limited to: hafnium silicate (HfSi), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Substrate 104 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
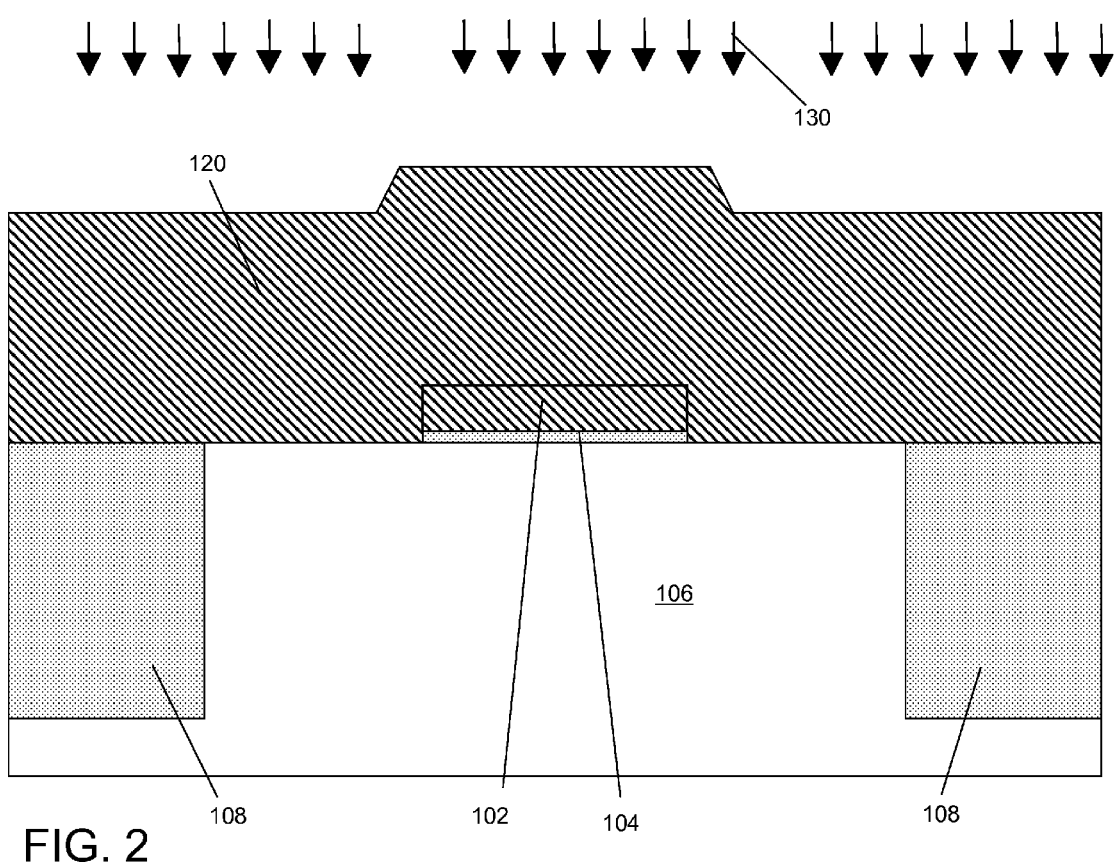

FIG. 2 shows forming (e.g., by depositing) a poly SiGe layer 120 over poly SiGe pedestal 102 after removal of photoresist 110 (FIG. 1). Poly SiGe layer 120 may have a thickness of, for example, approximately 50 nm to approximately 100 nm, with 'approximately' in the range of +/−1.0 nm. Poly SiGe layer 120 may also have an atomic fraction concentration of germanium of approximately 0.01% to approximately 0.03%. FIG. 2 also shows doping 130 poly SiGe layer 120. Doping 130 may include ion implanting or in-situ doping of poly SiGe layer 120 during formation. The dopant 130 may vary depending on the type of device to be formed, i.e., n-type dopant for an NFET and p-type dopant for a PFET.

Figure 3:
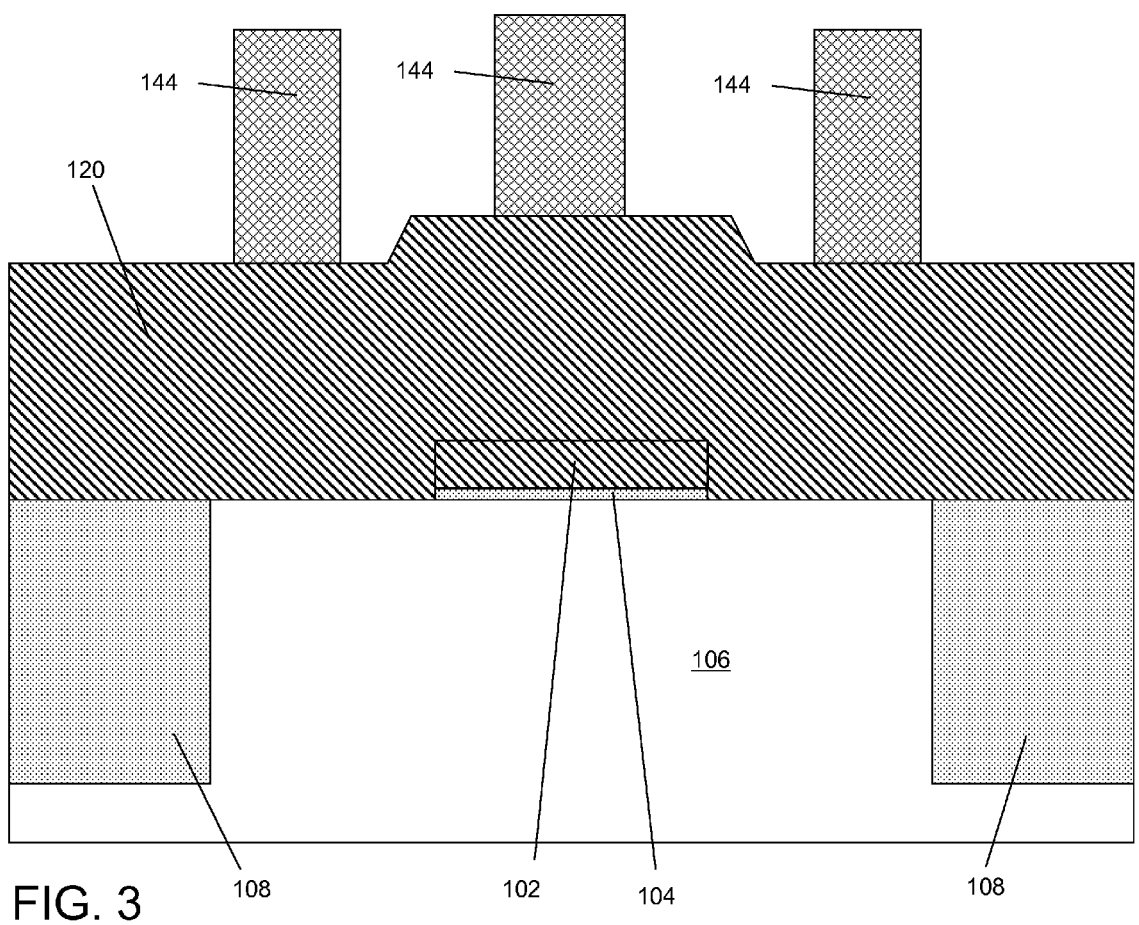
Figure 4:
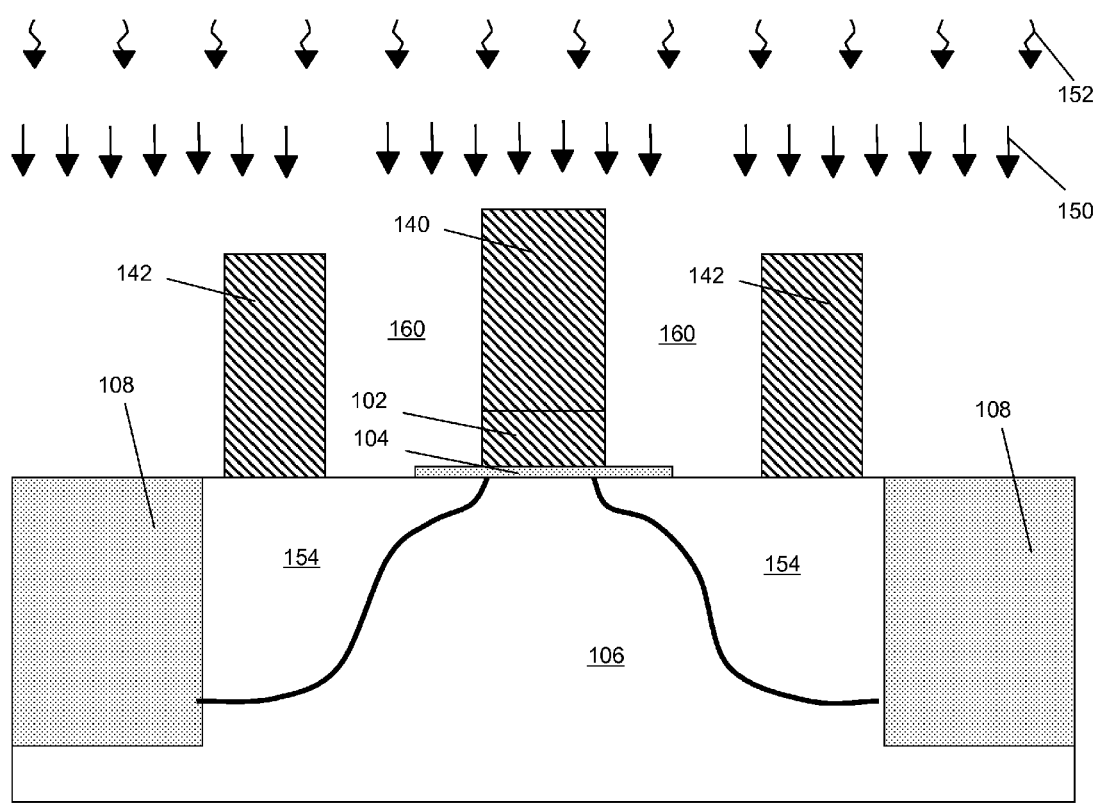

FIGS. 3-4 show simultaneously forming a gate 140 and a contact 142 to each side of gate 140 from poly SiGe layer 120 (FIG. 3). As shown in FIG. 3, a photoresist 144 may be deposited and patterned, and then gate 140 and contacts 142 may be etched from poly SiGe layer 120, e.g., using a RIE or wet etch selective to gate dielectric 104 and substrate 106. Photoresist 144 is then removed using any known technique. Poly SiGe pedestal 102 protects gate dielectric 104 from damage during photoresist 144 removal and can be used to adjust a height offset between gate 140 and contacts 142. Portions of gate dielectric 104 may be left exposed after this process.

FIG. 4 also shows performing a halo and extension implantation 150 prior to annealing 152 to drive the dopant from gate 140 and contacts 142 into substrate 106 to form a source/drain region 154 below contacts 142. In this case, annealing 152 may include a first thermal anneal (e.g., approximately 800° C. to approximately 1100° C.) prior to halo and extension implantation 150, and a second laser anneal after halo and extension implantation 150.

Turning to FIG. 5, filling a space 160 (FIG. 4) between gate 140 and contacts 142 is shown. This process may include, for example, as shown in FIG. 5, depositing silicon nitride 162 over gate 140 and contacts 142, and etching 164 (e.g., RIE) the silicon nitride back except between gate 140 and contacts 142, resulting in, as shown in FIG. 6, silicon nitride regions 162.

FIGS. 6-7 show forming silicide 170 (FIG. 7) in gate 140 and contacts 142. Silicide 170 may be formed using any now known or later developed technique, e.g., depositing a metal 172 (FIG. 6) such as titanium, nickel, cobalt, etc., annealing 174 to have the metal react with silicon, and removing unreacted metal. Where nickel is used, annealing 174 may be approximately 300° C. to approximately 500° C., where 'approximately' is +/−5° C. As shown in FIG. 7, silicide forming may include forming silicide fully in contacts 142, and forming silicide fully in gate 140 stopping adjacent to poly SiGe pedestal 102. Silicide forming may also include providing enough metal 172 to form silicide 176 in at least a portion of source/drain region 154. However, silicide in source/drain region 154 may not be necessary.

FIG. 7 shows a structure 200 including poly SiGe gate 140 and poly SiGe contact 142 to each side of gate 140. Contacts 142 are fully silicided and self-aligned to gate 140.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
    forming a polysilicon germanium (poly SiGe) pedestal over a gate dielectric over a substrate;
    forming a poly SiGe layer over the poly SiGe pedestal, the poly SiGe layer having a thickness greater than the poly SiGe pedestal;
    doping the poly SiGe layer;
    simultaneously forming a gate and a contact to each side of the gate from the poly SiGe layer, the gate positioned over the poly SiGe pedestal;
    performing a thermal anneal; then
    performing a halo and extension implantation; then
    performing a laser anneal; wherein the thermal and laser annealing drives the dopant from the gate and the contacts into the substrate to form a source/drain region below the contacts;
    filling a space between the gate and the contacts; and
    forming silicide in the gate and the contacts, wherein the silicide forming includes forming silicide fully in the contacts, and forming silicide fully in the gate stopping adjacent to the poly SiGe pedestal, and wherein the silicide forming of the contacts includes forming silicide in at least a portion of the source/drain region.

2. The method of claim 1, further comprising forming at least one isolation region in the substrate.

3. The method of claim 1, wherein the poly SiGe pedestal has a thickness of approximately 5 nanometers (nm) to approximately 30 nm, and the poly SiGe layer has a thickness of approximately 50 nm to approximately 100 nm.

4. The method of claim 1, wherein the poly SiGe pedestal and the poly SiGe layer have an atomic fraction concentration of germanium in the poly SiGe of approximately 0.01% to approximately 0.03%.

5. The method of claim 1, wherein the annealing includes a thermal anneal.

6. The method of claim 1, wherein the filling includes depositing silicon nitride over the gate and the contacts, and etching the silicon nitride back except between the gate and the contacts.

* * * * *